(12) United States Patent  
Blanchard

(10) Patent No.: US 6,566,201 B1  
(45) Date of Patent: May 20, 2003

(54) METHOD FOR FABRICATING A HIGH VOLTAGE POWER MOSFET HAVING A VOLTAGE SUSTAINING REGION THAT INCLUDES DOPED COLUMNS FORMED BY RAPID DIFFUSION

(75) Inventor: Richard A. Blanchard, Los Altos, CA (US)

(73) Assignee: General Semiconductor, Inc., Melville, NY (US)

( * ) Notice: Subject to any disclaimer, the term of this patent is extended or adjusted under 35 U.S.C. 154(b) by 0 days.

(21) Appl. No.: 10/039,068

(22) Filed: Dec. 31, 2001

(51) Int. Cl.$^7$ .............................................. H01L 21/336
(52) U.S. Cl. .................... 438/268; 438/270; 438/561
(58) Field of Search ................... 438/268, 558, 438/560, 561, 563

(56) References Cited

U.S. PATENT DOCUMENTS

| | | | |
|---|---|---|---|
| 4,140,558 A | * 2/1979 | Murphy et al. ............. | 257/517 |
| 4,419,150 A | * 12/1983 | Soclof ........................ | 257/559 |
| 4,569,701 A | * 2/1986 | Oh ...................... | 148/DIG. 35 |
| 4,711,017 A | * 12/1987 | Lammert ........... | 148/DIG. 147 |
| 4,893,160 A | 1/1990 | Blanchard .................. | 357/23.4 |
| 5,108,783 A | * 4/1992 | Tanigawa et al. ........... | 438/359 |
| 5,216,275 A | 6/1993 | Chen .......................... | 257/493 |
| 2001/0026977 A1 | 10/2001 | Hattori et al. .............. | 438/268 |
| 2001/0036704 A1 | 11/2001 | Hueting et al. ............. | 438/270 |
| 2001/0053568 A1 | * 12/2001 | Deboy et al. ............... | 438/138 |

OTHER PUBLICATIONS

U.S. patent application Ser. No. 10/039,241, Blanchard, filed Dec. 31, 2001.
U.S. patent application Ser. No. 10/038,845, Blanchard, filed Dec. 31, 2001.
U.S. patent application Ser. No. 09/970,758, Blanchard et al., filed Oct. 4, 2001.
U.S. patent application Ser. No. 10/039,284, Blanchard, filed Dec. 31, 2001.
Xing, Bi Chen et al., "A Novel High–Voltage Sustaining Structure with Buried Oppositely Doped Regions," *IEEE Transactions on Electron Devices*, vol. 47, No. 6, Jun. 2000, pp. 1280–1285.
N. Cezac et al., "A New Generation of Power Unipolar Devices: the Concept of the FLoating Islands MOS Transistor (FLIMOST)," Proceedings of the 12th International Symposium on Power Semiconductor Devices & ICs, Toulouse, France, May 22–25, 2000, pp. 69–72.
Ming–Kwang Lee et al., "On the Semi–Insulating Polycrystalline Silicon Resistor," *Solid State Electronics*, vol. 27, No. 11, 1984, pp. 995–1001.

* cited by examiner

*Primary Examiner*—John F. Niebling
*Assistant Examiner*—Angel Roman
(74) *Attorney, Agent, or Firm*—Mayer Fortkort & Williams, PC; Stuart H. Mayer, Esq.; Karin L. Williams, Esq.

(57) ABSTRACT

A method for fabricating a high voltage power MOSFFT having a voltage sustaining region that includes doped columns formed by rapid diffusion. A high voltage semiconductor device having a substrate of a first or second conductivity type, an epitaxial layer of the first conductivity on the substrate, and a voltage sustaining region formed in the epitaxial layer, the voltage sustaining region including a column having a second conductivity type formed along at least outer sidewalls of a filled trench, the column including at least one first diffused region and a second diffused region, the first diffused region being connected by the second region and the second region having a junction depth measured from the trench sidewall that is less than the junction depth of the first region and a third region of a second conductivity type that extends from the surface of the epitaxial layer to intersect at least one of the first and second regions of second conductivity type.

17 Claims, 9 Drawing Sheets

THE DOPANT DISTRIBUTION OF A HIGH VOLTAGE VERTICAL
DMOS TRANSISTOR WITH A RELATIVELY LOW ON-RESISTANCE

STEP

1. GROW/DEPOSIT A TRENCH ETCH-STOP LAYER

2. MASK AND ETCH THE TRENCH ETCH-STOP LAYER

3. ETCH THE TRENCH

STEP

4. GROW AN OXIDE LAYER IN THE TRENCH TO PROTECT THE SIDEWALLS, BUT ALLOW THE IMPLANT IN THE TRENCH BOTTOM

5. PERFORM AN ION IMPLANT STEP

STEP

6. DIFFUSE THE DOPANT

STEP

7. ETCH THE TRENCH TO THE NEXT DEPTH (EXCEPT PERHAPS FOR THE LAST BURIED REGIONS)

FIG. 5(e)(ii)

STEP

8. PERFORM STEPS 4-7 AS MANY TIMES AS REQUIRED (STRUCTURES BOTH WITH AND WITHOUT A DOPED REGION AT THE TRENCH BOTTOM MAY BE FABRICATED)

FIG. 5(f)(ii)

STEP

9. COVER THE SIDEWALLS OF THE TRENCH WITH A MATERIAL SUCH AS POLYCRYSTALLINE SILICON (OR A SEQUENCE OF MATERIALS) THAT ALLOWS THE DOPANT IN THE SIDEWALLS OF THE TRENCH TO DIFFUSE RAPIDLY AND THEN PERFORM A DIFFUSION. THE RAPID DIFFUSION OF THE DOPANT IN THE LAYER ON THE SIDEWALL DOPES THE ENTIRE SIDEWALL (AND BOTTOM IF UNDOPED) OF EACH TRENCH.

FIG. 5(g)(ii)

STEP

10. FILL THE TRENCH WITH A MATERIAL SUCH AS THERMALLY GROWN OR DEPOSITED SILICON DIOXIDE, DEPOSITED SILICON NITRIDE OR HIGH RESISTIVITY POLYSILICON, OR A COMBINATION OF THERMALLY GROWN AND DEPOSITED LAYERS AND PLANARIZE.

US 6,566,201 B1

METHOD FOR FABRICATING A HIGH VOLTAGE POWER MOSFET HAVING A VOLTAGE SUSTAINING REGION THAT INCLUDES DOPED COLUMNS FORMED BY RAPID DIFFUSION

RELATED APPLICATIONS

This application is related to copending U.S. patent application Ser. No. 09/970,972 entitled "Method for Fabricating a Power Semiconductor Device Having a Floating Island Voltage Sustaining Layer," filed in the United States Patent and Trademark Office on Oct. 4, 2001.

FIELD OF THE INVENTION

The present invention relates generally to semiconductor devices, and more particularly to power MOSFET devices.

BACKGROUND OF THE INVENTION

Power MOSFET devices are employed in applications such as automobile electrical systems, power supplies, and power management applications. Such devices should sustain high voltage in the off-state while having a low voltage drop and high current flow in the on-state.

FIG. 1 illustrates a typical structure for an N-channel power MOSFET. An N-epitaxial silicon layer 1 formed over an N+ silicon substrate 2 contains p-body regions 5a and 6a, and N+ source regions 7 and 8 for two MOSFET cells in the device. P-body regions 5 and 6 may also include deep p-body regions 5b and 6b. A source-body electrode 12 extends across certain surface portions of epitaxial layer 1 to contact the source and body regions. The N-type drain for both cells is formed by the portion of N-epitaxial layer 1 extending to the upper semiconductor surface in FIG. 1. A drain electrode is provided at the bottom of N+ substrate 2. An insulated gate electrode 18 typically of polysilicon lies primarily over the body and portions of the drain of the device, separated from the body and drain by a thin layer of dielectric, often silicon dioxide. A channel is formed between the source and drain at the surface of the body region when the appropriate positive voltage is applied to the gate with respect to the source and body electrode.

The on-resistance of the conventional MOSFET shown in FIG. 1 is determined largely by the drift zone resistance in epitaxial layer 1. The drift zone resistance is in turn determined by the doping and the layer thickness of epitaxial layer 1. However, to increase the breakdown voltage of the device, the doping concentration of epitaxial layer 1 must be reduced while the layer thickness is increased. Curve 20 in FIG. 2 shows the on-resistance per unit area as a function of the breakdown voltage for a conventional MOSFET. Unfortunately, as curve 20 shows, the on-resistance of the device increases rapidly as its breakdown voltage increases. This rapid increase in resistance presents a problem when the MOSFET is to be operated at higher voltages, particularly at voltages greater than a few hundred volts.

FIG. 3 shows a MOSFET that is designed to operate at higher voltages with a reduced on-resistance. This MOSFET is disclosed in paper No. 26.2 in the Proceedings of the IEDM, 1998, p. 683. This MOSFET is similar to the conventional MOSFET shown in FIG. 2 except that it includes p-type doped regions 40 and 42 which extend from beneath the body regions 5 and 6 into the drift region of the device. The p-type doped regions 40 and 42 define columns in the drift region that are separated by n-type doped columns, which are defined by the portions of the epitaxial layer 1 adjacent the p-doped regions 40 and 42. The alternating columns of opposite doping type cause the reverse voltage to be built up not only in the vertical direction, as in a conventional MOSFET, but in the horizontal direction as well. As a result, this device can achieve the same reverse voltage as in the conventional device with a reduced layer thickness of epitaxial layer 1 and with increased doping concentration in the drift zone. Curve 25 in FIG. 2 shows the on-resistance per unit area as a function of the breakdown voltage of the MOSFET shown in FIG. 3. Clearly, at higher operating voltages, the on-resistance of this device is substantially reduced relative to the device shown in FIG. 1, essentially increasing linearly with the breakdown voltage.

The improved operating characteristics of the device shown in FIG. 3 are based on charge compensation in the drift region of the transistor. That is, the doping in the drift region is substantially increased, e.g., by an order of magnitude or more, and the additional charge is counterbalanced by the addition of columns of opposite doping type. The blocking voltage of the transistor thus remains unaltered. The charge compensating columns do not contribute to the current conduction when the device is in its on state. These desirable properties of the transistor depend critically on the degree of charge compensation that is achieved between adjacent columns of opposite doping type. Unfortunately, nonuniformities in the dopant gradient of the columns can be difficult to avoid as a result of limitations in the control of process parameters during their fabrication. For example, diffusion across the interface between the columns and the substrate and the interface between the columns and the p-body region will give rise to changes in the dopant concentration of the portions of the columns near those interfaces.

The structure shown in FIG. 3 can be fabricated with a process sequence that includes multiple epitaxial deposition steps, each followed by the introduction of the appropriate dopant. Unfortunately, epitaxial deposition steps are expensive to perform and thus this structure is expensive to manufacture. Another technique for fabricating these devices is shown in copending U.S. application Ser. No. 09/970,972, in which a trench is successively etched to different depths. A dopant material is implanted and diffused through the bottom of the trench after each etching step to form a series of doped regions (so-called "floating islands") that collectively function like the p-type doped regions 40 and 42 seen in FIG. 3. However, the on-resistance of a device that uses the floating island technique is not as low as an identical device that uses continuous columns.

Accordingly, it would be desirable to provide a method of fabricating the MOSFET structure shown in FIG. 3 that requires a minimum number of deposition steps so that it can be produced less expensively while also allowing sufficient control of process parameters so that a high degree of charge compensation can be achieved in adjacent columns of opposite doping type in the drift region of the device.

SUMMARY OF THE INVENTION

The present invention provides a high voltage semiconductor device and a method of forming same. The method proceeds by:

A. providing a substrate of a first or second conductivity type;

B. forming a voltage sustaining region on the substrate by:
   1. depositing an epitaxial layer on the substrate, the epitaxial layer having a first conductivity type;
   2. forming at least one trench in the epitaxial layer;

3. depositing a barrier material along the walls of the trench;
4. implanting a dopant of a second conductivity type through the barrier material into a portion of the epitaxial layer adjacent to and beneath the bottom of the trench;
5. diffusing the dopant to form a first doped layer in the epitaxial layer;
6. removing the barrier material from at least the bottom of the trench;
7. etching the trench through the first doped layer to a greater depth and repeating steps (B.3)–(B.5) to form a second doped layer vertically below the first doped layer;
8. removing the barrier material from surfaces of the trench.
9. depositing a diffusion facilitating material along the walls of the trench, the implanted dopant having a higher diffusion coefficient in the deposited material than in the epitaxial layer of the voltage sustaining layer;
10. diffusing the dopant into the diffusion facilitating material so that the dopant diffuses into sidewalls of the trench between the first and second doped layers;
11. depositing a filler material in the trench to substantially fill the trench; and
C. forming above but in contact with the voltage sustaining region at least one region of the second conductivity type.

In accordance with one aspect of the invention the method also includes the steps of: forming a gate conductor above a gate dielectric region; forming at least one body region in the epitaxial layer to define a drift region therebetween, the body region having a second conductivity type; and forming at least one source region of the first conductivity type in the at least one body region.

In accordance with another aspect of the invention, the barrier material is an oxide material.

In accordance with another aspect of the invention the oxide material is silicon dioxide.

In accordance with another aspect of the invention, the material filling the trench is a dielectric material such as silicon dioxide, silicon nitride or high resistivity polycrystalline silicon.

DETAILED DESCRIPTION

In accordance with the present invention, a method of forming p-type columns in the voltage sustaining layer of a semiconductor power device may be generally described as follows. First, one or more trenches are etched in the epitaxial layer that is to form the voltage sustaining region of the device. Each trench is centered where a column is to be located. A first doped region is formed by implanting p-type dopant material into the bottom of the trench. The implanted material is diffused into the portion of the voltage sustaining region located immediately adjacent to and below the trench bottom. The trenches are subsequently etched to a greater depth so that a second doped region can be formed by again implanting and diff-using a p-type dopant material. The aforementioned process is repeated until the desired number of doped regions have been formed. The trench is subsequently lined with a material that facilitates the rapid diffusion of the implanted dopant material. A subsequent diffusion step is performed so that the dopant diffuses along the sidewalls of the trench, interconnecting the various doped regions, thus forming a p-type column. Finally, the trenches are filled with a material that does not adversely affect the electrical characteristics of the device. Exemplary materials that may be used for the material filling the trenches include highly resistive polysilicon, a dielectric such as silicon dioxide, or other materials and combinations of materials.

Figure 1:
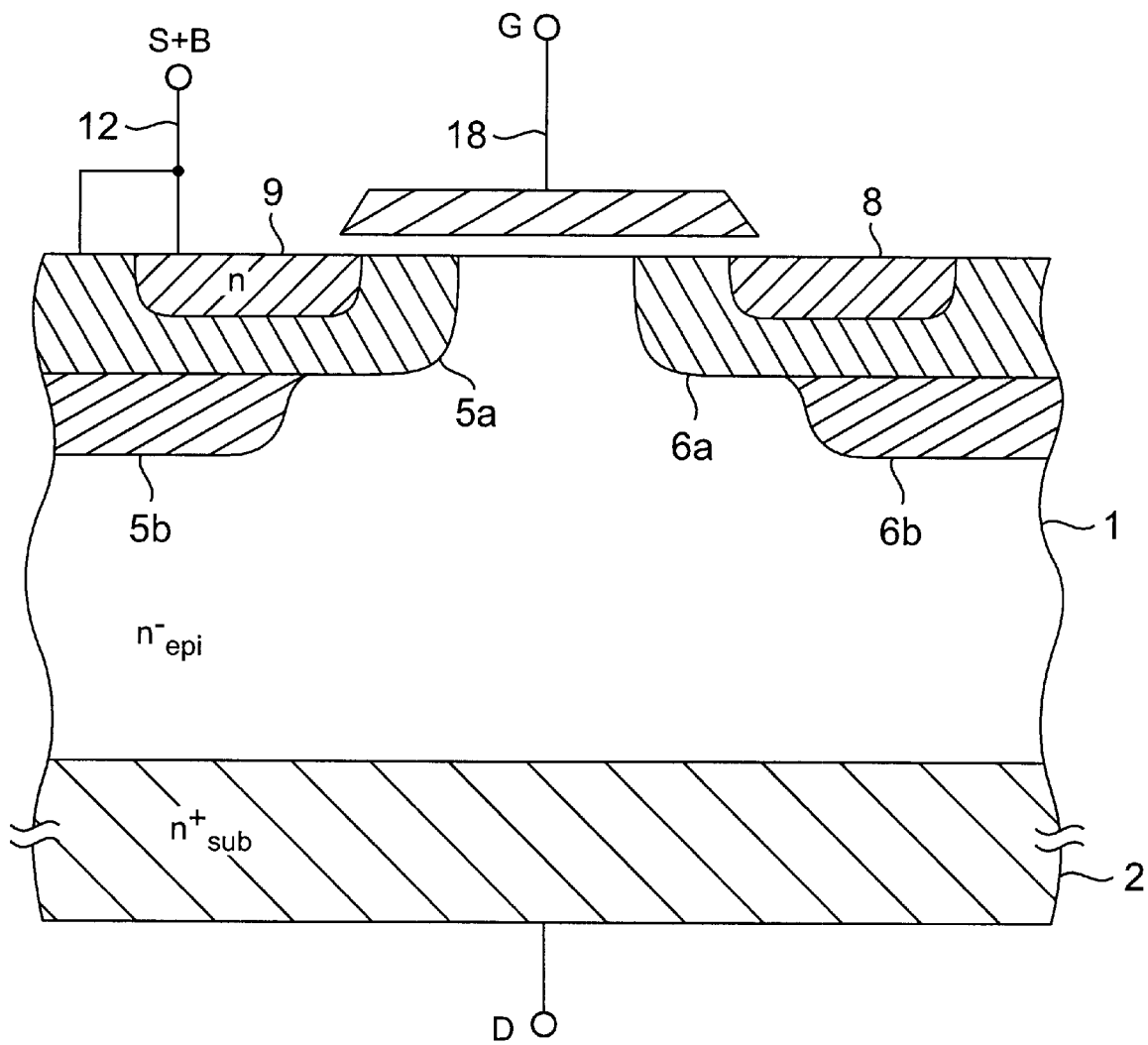
FIG. 1 shows a cross-sectional view of a conventional power MOSFET structure.
Figure 2:
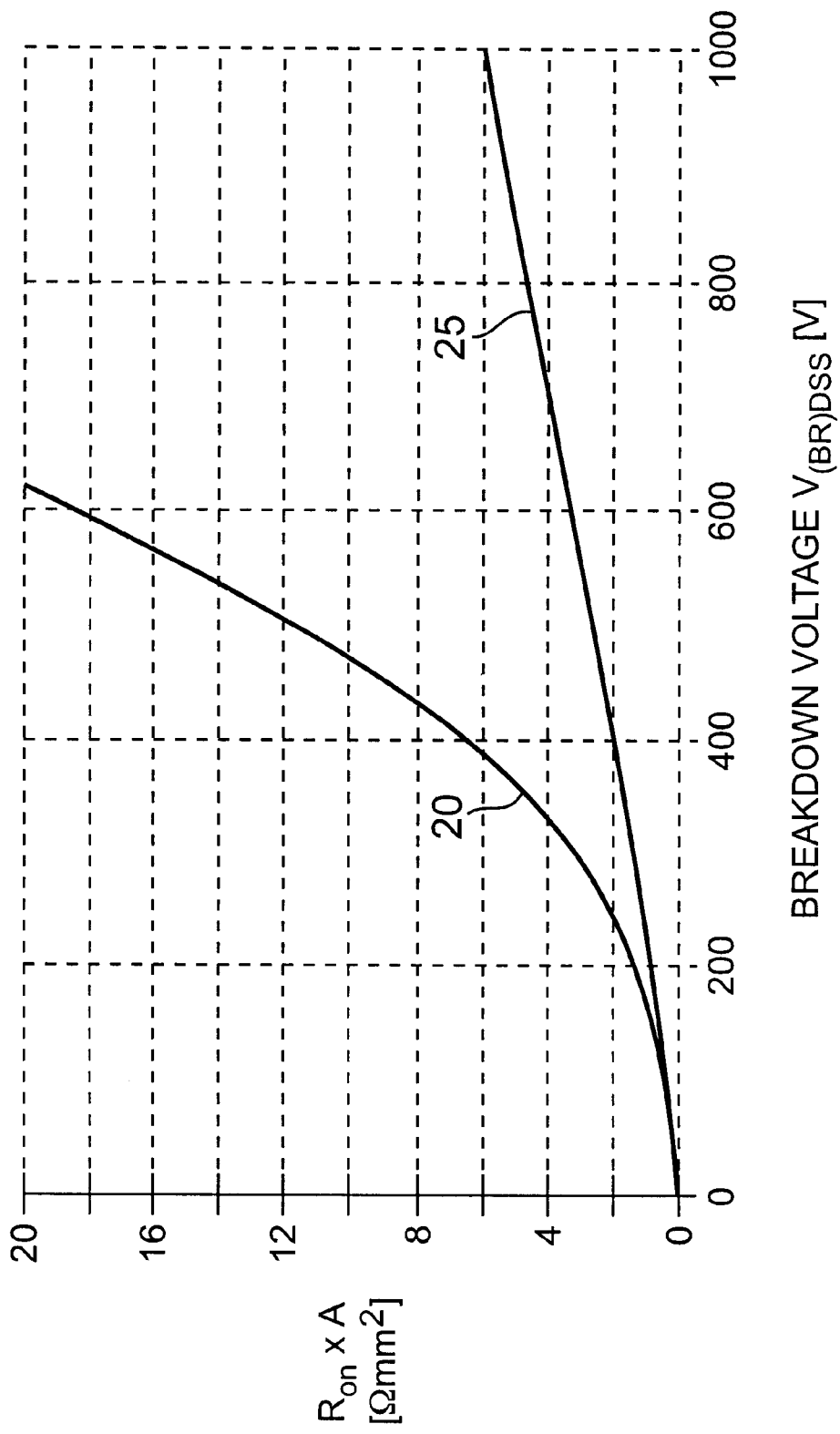
FIG. 2 shows the on-resistance per unit area as a function of the breakdown voltage for a conventional power MOSFET.
Figure 3:
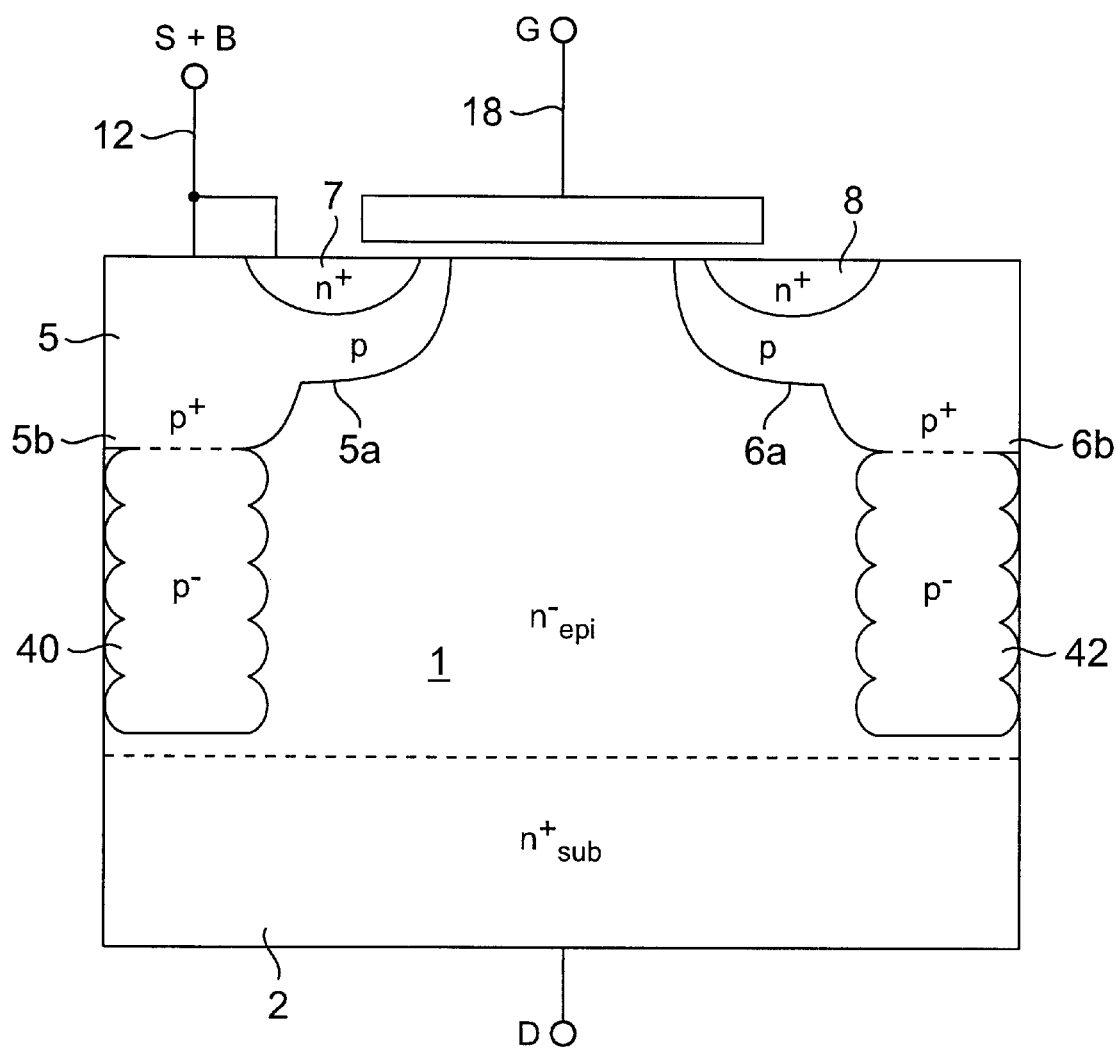
FIG. 3 shows a MOSFET structure that includes a voltage sustaining region with columns of p-type dopant located below the body region, which is designed to operate with a lower on-resistance per unit area at the same voltage than the structure depicted in FIG. 1.
Figure 4:
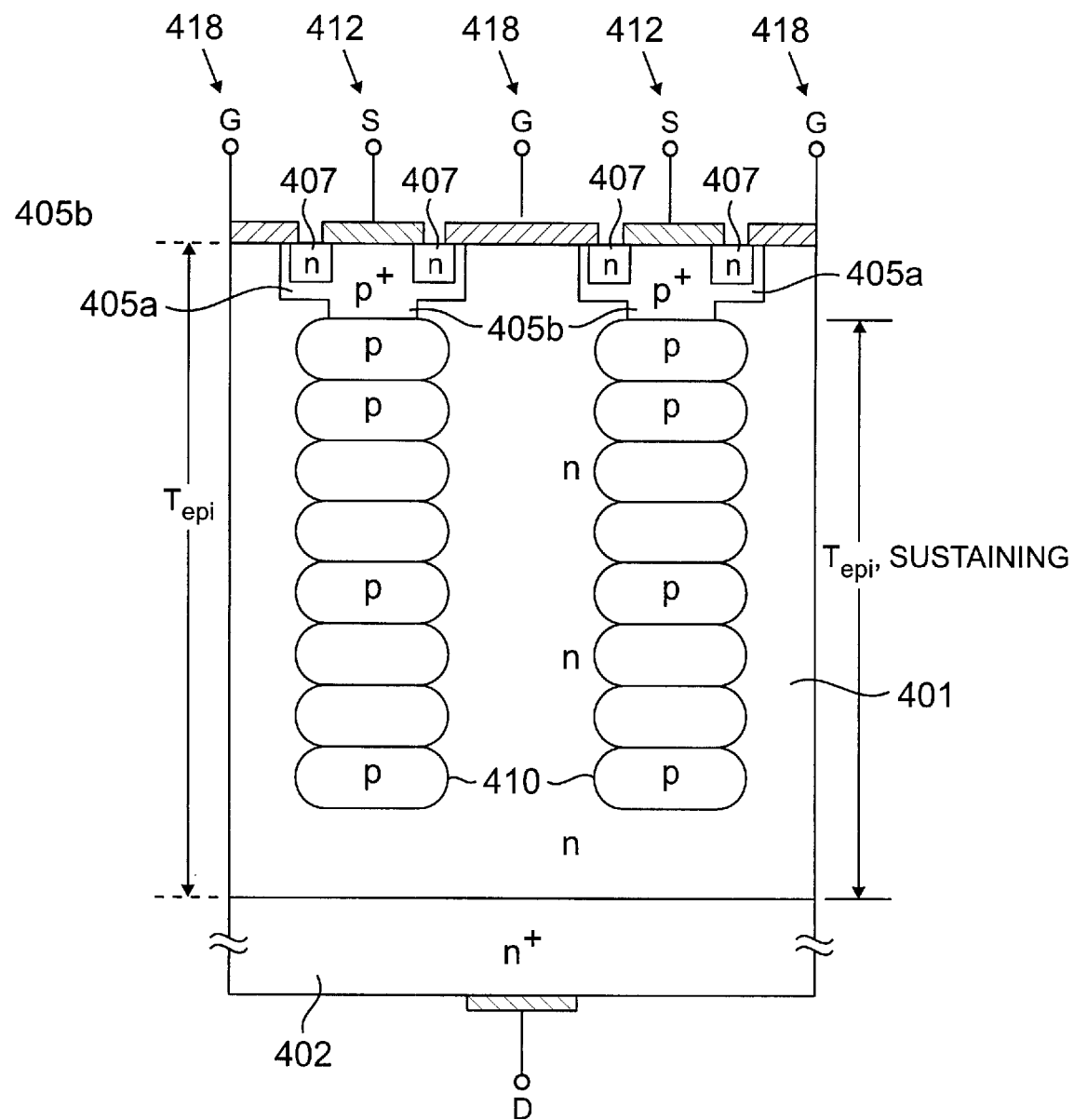
FIG. 4 shows a MOSFET structure that includes a voltage sustaining constructed in accordance with the present invention.

FIG. 4 shows a power semiconductor device constructed in accordance with the present invention. An N-type epitaxial silicon layer 401 formed over an N+ silicon substrate 402 contains P-body regions 405, and N+ source regions 407 for two MOSFET cells in the device. As shown, P-body regions 405a may also include deep P-body regions 405b. A source-body electrode 412 extends across certain surface portions of epitaxial layer 401 to contact the source and body regions. The N-type drain for both cells is formed by the portion of N-epitaxial layer 401 extending to the upper semiconductor surface. A drain electrode is provided at the bottom of N+ substrate 402. An insulated gate electrode 418 typically comprising polysilicon layers lies primarily over the body portions of the drain, of the device, separated from body and drain by a thin layer of dielectric, typically silicon dioxide. A channel is formed between the source and drain at the surface of the body region when the appropriate positive voltage is applied to the gate with respect to the source and body electrode. A series of p-doped columns 410 are located in the voltage sustaining region of the device defined by epitaxial silicon layer 401.

The power semiconductor device shown in FIG. 4 may be fabricated in accordance with the following exemplary steps, which are illustrated in FIGS. 5(a)–5(g).

First, the N-type doped epitaxial layer 501 is conventionally grown on an N+ doped substrate 502. Epitaxial layer 501 is typically 10–50 microns in thickness for a 400–800 V device with a resistivity of 5–40 ohm-cm. Next, a dielectric masking layer is formed by covering the surface of epitaxial layer 501 with a dielectric layer, which is then conventionally exposed and patterned to leave a mask portion that defines the location of the trench 520. The trench 520 is dry etched through the mask openings by reactive ion etching to an initial depth that may range from 5–15 microns. In particular, if "x" is the number of equally spaced horizontal rows of floating islands that are initially desired, the trench 520 should be initially etched to a depth of approximately 1/(x+1) of the thickness of epitaxial layer 502 that is to be between the bottom of the body region and the top of the N+ doped substrate. The sidewalls of each trench may be smoothed, if needed. First, a dry chemical etch may be used to remove a thin layer of oxide (typically about 500–1000 A) from the trench sidewalls to eliminate damage caused by the reactive ion etching process. Next, a sacrificial silicon dioxide layer is grown over the trench 520. The sacrificial layer is removed either by a buffer oxide etch or an HF etch so that the resulting trench sidewalls are as smooth as possible.

Figure 5A:
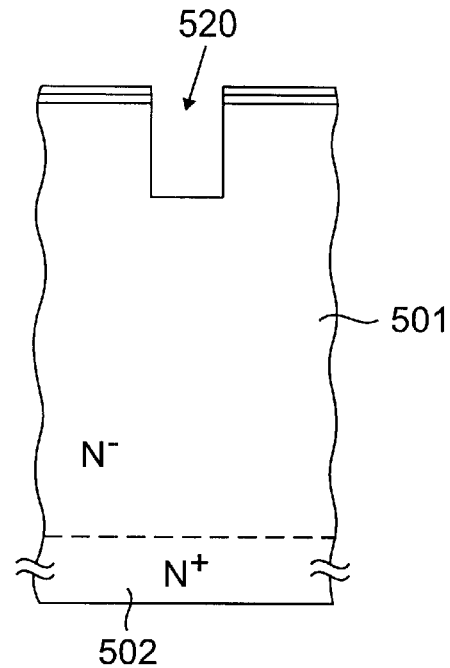
FIGS. 5(a)–5(g) show a sequence of exemplary process steps that may be employed to fabricate the voltage sustaining region constructed in accordance with the present invention.
Figure 5B:
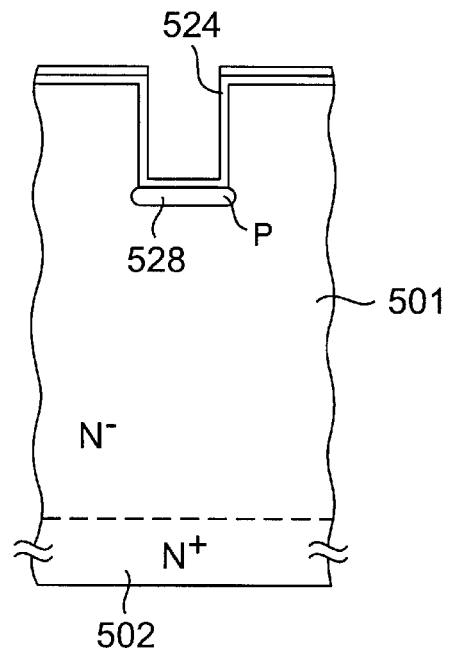
Figure 5C:
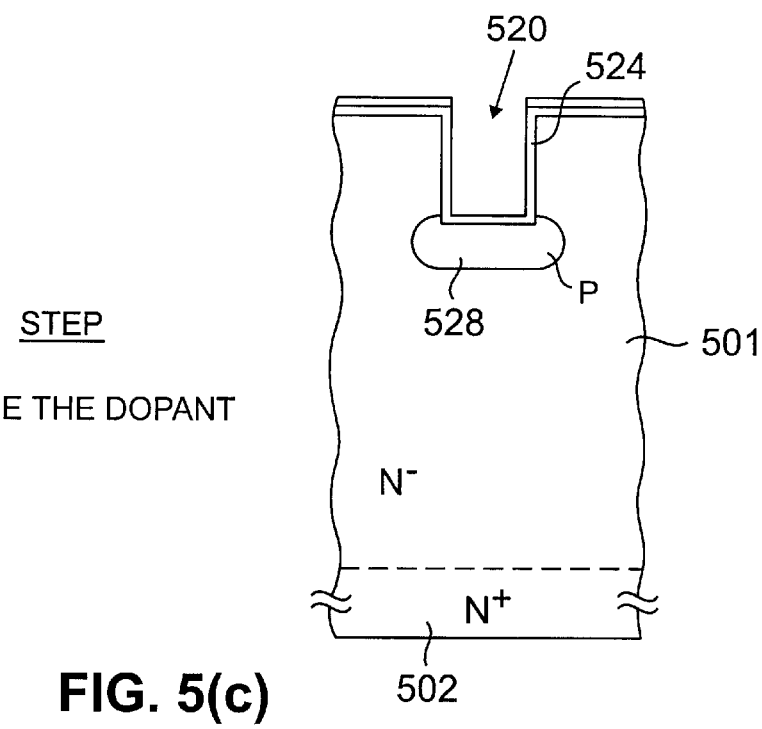

In FIG. 5(b), a layer of silicon dioxide 524 is grown in trench 520. The thickness of the silicon dioxide layer 524 should be sufficient to prevent implanted atoms from penetrating the silicon adjacent to and below the sidewalls of the trench 520, while allowing the implanted atoms to penetrate the oxide layer 524 at the bottom of the trench 520 so that they can be deposited into the silicon adjacent and beneath the trench bottom. Next, a dopant 528 such as boron is implanted through the oxide layer at the bottom of the trench 520. The total dose of dopant and the implant energy should be chosen such that the amount of dopant left in the epitaxial layer 501 after the subsequent diffusion and etching steps are performed at each horizontal level satisfies the breakdown requirements of the resulting device. Next, in FIG. 5(c), a high temperature diffusion step is performed to "drive-in" the implanted dopant 528 both vertically and laterally.

Figure 5D:
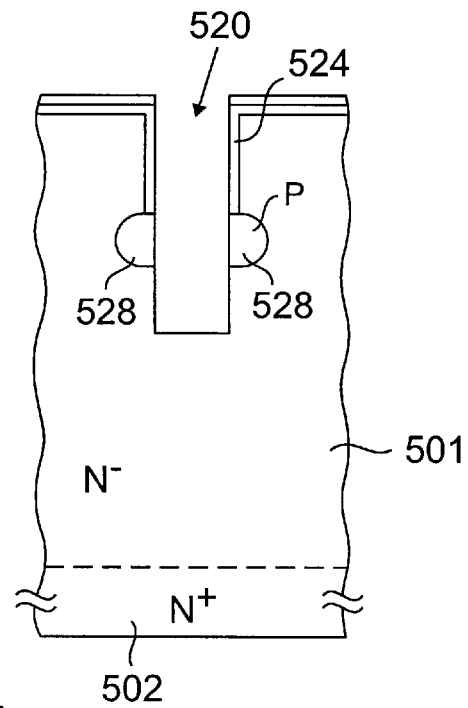
Figure 5E:
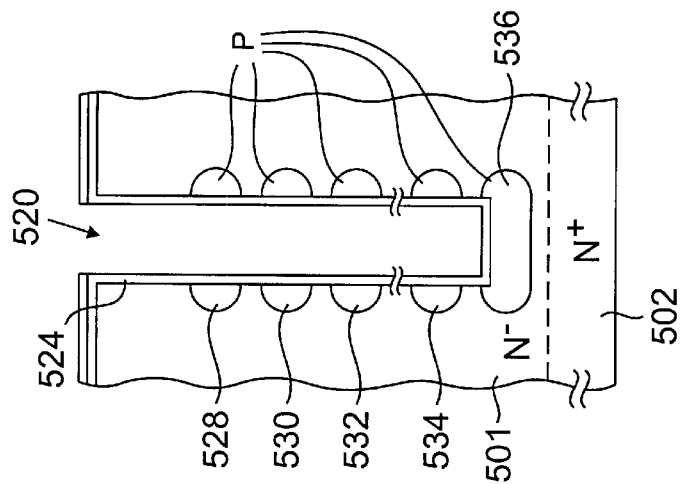
Figure 5E:
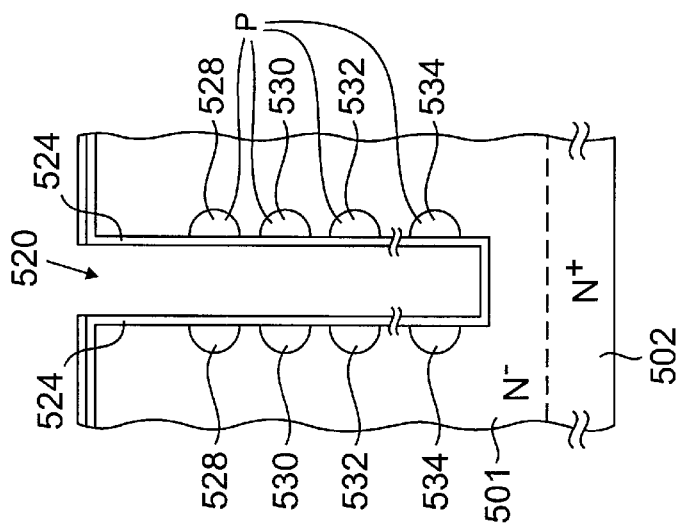

In FIG. 5(d), oxide layer 524 is removed from the bottom of the trench 520. The oxide layer 524 may or may not be removed from the sidewalls of the trench 520. The depth of the trench 520 is then increased by an amount approximately equal to 1/(x+1) of the thickness of epitaxial layer 501 that is located between the bottom of the body region and the N+-doped substrate. In FIG. 5(e)(i), a second doped region 530 is fabricated by repeating the steps of growing an oxide layer on the trench walls, implanting and diffusing dopant through the bottom of the trench, and removing the oxide layer from the bottom of the trench. This process can be repeated as many times as necessary to form "x" horizontally arranged doped regions, where "x" is selected to provide the desired breakdown voltage. For example, in FIG. 5(e)(i), four such doped regions 528, 530, 532, and 534 are shown. As shown in FIG. 5(e)(i), once the last doped region is formed, the trench depth is increased by an amount sufficient to etch through the last doped region. In some embodiments of the invention, such as shown in FIG. 5(e)(ii), the last doped region 536 is not etched through.

Figure 5F:
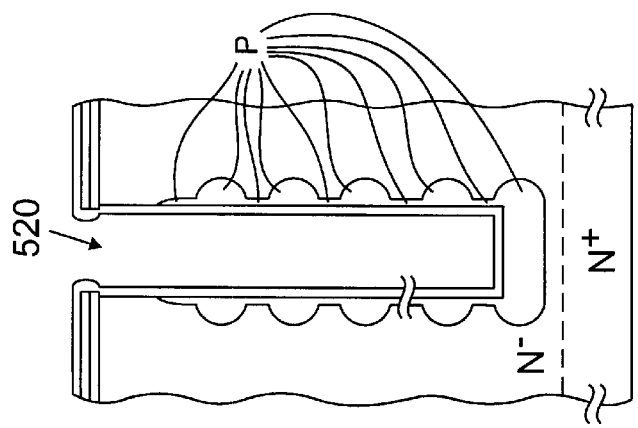
Figure 5F:
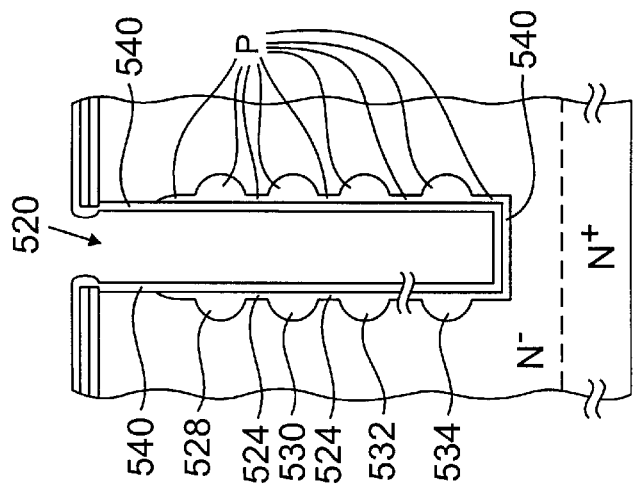

In FIG. 5(f)(i), the oxide layer 524 is removed from the surfaces of the trench 520 and it is lined with a material 540 in which dopant diffuses more rapidly than in the material forming epitaxial layer 501. The p-type dopant diffuses from the p-doped regions 528, 530, 532, and 534 into layer 540 in a subsequent diffusion step. During this diffusion step, this dopant also diffuses in material 540 at a relatively rapid rate along the sidewalls of the trench 520. In this way doped regions 528, 530, 532, and 534 are interconnected by the dopant along the sidewalls of the trench 520. Accordingly, a continuously connected column of charge is advantageously formed without the need for multiple epitaxial deposition steps. Following the rapid diffusion step, the material 540 facilitating the rapid diffusion may be removed (by etching, for instance), converted to another species (by oxidation, for instance), or left in the trench (if the material is a dielectric, for instance). FIG. 5(f)(ii) shows an embodiment of the invention in which the deposition and rapid diffusion steps are performed on the structure depicted in FIG. 5(e)(ii), and in which doped region 536 is present.

In some embodiments of the invention the material 540 facilitating rapid diffusion may be polycrystalline silicon, which is particularly advantageous when used in connection with commonly used dopants such as boron and phosphorus. Polycrystalline silicon is also advantageous because it may be etched from the sidewalls of the trench 520 or converted to silicon dioxide using a thermal oxidation technique. Alternatively, if gallium is employed as the dopant forming the doped regions 528, 530, 532, and 534, the material 540 may be silicon dioxide because gallium diffuses much more rapidly in silicon dioxide than in silicon.

After the rapid diffusion step and any subsequent processing steps, the trench 520 is filled with a material 550 that does not adversely affect the characteristics of the device. Exemplary materials include, but are not limited to, thermally grown silicon dioxide, a deposited dielectric such as silicon dioxide, silicon nitride, high resistivity polysilicon, or a combination of thermally grown and deposited layers of these or other materials. Finally, the surface of the structure is planarized as shown in FIG. 5(g).

Figure 5G:
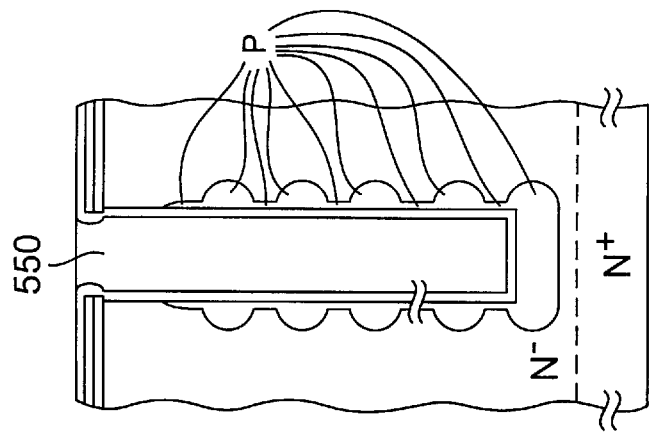
Figure 5G:
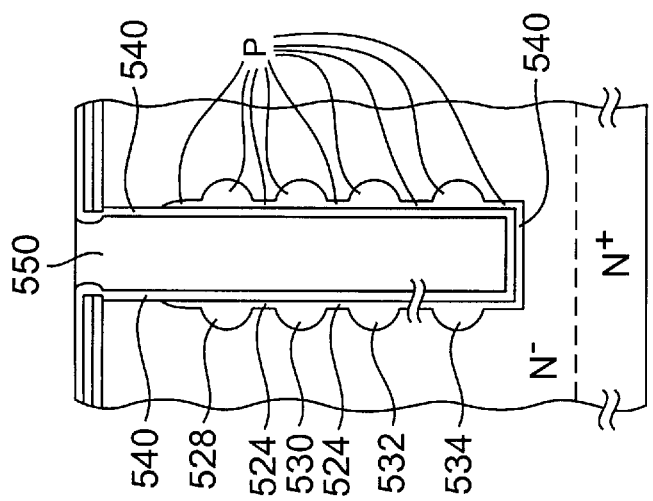

The aforementioned sequence of processing steps resulting in the structure depicted in FIG. 5(g) provides a voltage sustaining layer on which any of a number of different power semiconductor devices can be fabricated. As previously mentioned, such power semiconductor devices include vertical DMOS, V-groove DMOS, and trench DMOS MOSFETs, IGBTs and other MOS-gated devices. For instance, FIG. 4 shows an example of a MOSFET that includes a voltage sustaining layer constructed in accordance with the principles of the present invention. It should be noted that while FIG. 5 shows a single trench that is used to form a single p-type column, the present invention encompasses a voltage sustaining regions having single or multiple trenches to form any number of p-type columns.

Once the voltage sustaining region with the p-type column or columns have been formed as shown in FIG. 5, the MOSFET shown in FIG. 4 can be completed in the following manner. A thick field oxide layer is first grown. The gate oxide is grown after an active region has been defined using conventional photomask and etch processes. Next, a layer of polycrystalline silicon is deposited, doped, and oxidized. The polysilicon layer is then masked to form the gate regions. The p+ doped deep body regions 405b are formed using conventional masking, implantation and diffusion steps. For example, the p+-doped deep body regions are boron implanted at 20 to 200 KeV with a dosage from about $1 \times 10^{14}$ to $5 \times 10^{15}/cm^2$. The shallow body region 405a is formed in a similar fashion, but is self-aligned to the gate. The implant dose for this region will be $1 \times 10^{13}$ to $5 \times 10^{14}/cm^2$ at an energy of 20 to 100 KeV.

Next, a photoresist masking process is used to form a patterned masking layer that defines source regions 407. Source regions 407 are then formed by an implantation step that is self-aligned to the gate and a diffusion process. For example, the source regions may be implanted with arsenic at 20 to 100 KeV to a concentration that is typically in the range of $2 \times 10^{15}$ to $1.2 \times 10^{16}/cm^2$. After implantation, the arsenic is diffused to a depth of approximately 0.5 to 2.0 microns. The depth of the body region typically ranges from about 1–3 microns, with the P+ doped deep body region (if present) being slightly deeper. Finally, the masking layer is removed in a conventional manner. The DMOS transistor is completed in a conventional manner by depositing and reflowing a BPSG layer and etching this layer and the underlying oxide layer to form contact openings on the front surface. A metallization layer is also deposited and masked to define the source-body and gate electrodes. Also, a pad mask is used to define pad contacts. Finally, a drain contact layer is formed on the bottom surface of the substrate.

It should be noted that while a specific process sequence for fabricating the power MOSFET is disclosed, other process sequences may be used while remaining within the scope of this invention. For instance, the deep p+ doped body region may be formed before the gate region is defined. It is also possible to form the deep p+ doped body region prior to forming the trenches. In some DMOS structures, the P+ doped deep body region may be shallower than the P-doped body region, or in some cases, there may not even be a P+ doped body region.

Although various embodiments are specifically illustrated and described herein, it will be appreciated that modifications and variations of the present invention are covered by the above teachings and are within the purview of the appended claims without departing from the spirit and intended scope of the invention. For example, a power semiconductor device in accordance with the present invention may be provided in which the conductivities of the various semiconductor regions are reversed from those described herein. Moreover, while a vertical DMOS transistor has been used to illustrate exemplary steps required to fabricate a device in accordance with the present invention, other DMOS FETs and other power semiconductor devices such as diodes, bipolar transistors, power JFETs, IGBTs, MCTs, and other MOS-gated power devices may also be fabricated following these teachings.

What is claimed is:

1. A method of forming a high voltage semiconductor device comprising the steps of:
   A. providing a substrate of a first or second conductivity type;
   B. forming a voltage sustaining region on said substrate by:
   1. depositing an epitaxial layer on the substrate, said epitaxial layer having a first conductivity type;
   2. forming at least one trench in said epitaxial layer;
   3. depositing a barrier material along the walls of said trench;
   4. implanting a dopant of a second conductivity type through the barrier material into a portion of the epitaxial layer adjacent to and beneath the bottom of said trench;
   5. diffusing said dopant to form a first doped layer in said epitaxial layer;
   6. removing the barrier material from at least the bottom of the trench;
   7. etching the trench through the first doped layer to a greater depth and repeating steps (B.3)–(B.5) to form a second doped layer vertically below said first doped layer;
   8. removing the barrier material from surfaces of the trench;
   9. depositing a diffusion facilitating material along the walls of the trench, said implanted dopant having a higher diffusion coefficient in the deposited material than in the epitaxial layer of the voltage sustaining layer;
   10. diffusing said dopant into the diffusion facilitating material so that said dopant diffuses into sidewalls of the trench between said first and second doped layers;
   11. depositing a filler material in said trench to substantially fill said trench; and
   C. forming above but in contact with said voltage sustaining region at least one region of said second conductivity type.

2. The method of claim 1 further comprising the step of etching the trench through said second doped layer.

3. The method of claim 1 wherein step (C) further includes the steps of:
   forming a gate conductor above a gate dielectric region;
   forming at least one body region in the epitaxial layer to define a drift region therebetween, said body region having a second conductivity type;
   forming at least one source region of the first conductivity type in the at least one body region.

4. The method of claim 1 wherein said barrier material is an oxide material.

5. The method of claim 4 wherein said oxide material is silicon dioxide.

6. The method of claim 1 wherein said epitaxial layer has a given thickness and further comprising the steps of:
   D. etching the trench by an additional amount substantially equal to $1/(x+1)$ of said given thickness, where x is equal to or greater than two and corresponds to a prescribed number of doped layers to be formed in the voltage sustaining region;
   E. repeating steps (B.3)–(B.6) to form another doped layer vertically below said second doped layer; and
   F. repeating steps D–E until the prescribed number of doped layers have been formed; and
   G. etching the trench through the xth layer of said doped layers.

7. The method of claim 1 wherein said material filling the trench is a dielectric material.

8. The method of claim 7 wherein said dielectric material is silicon dioxide.

9. The method of claim 7 wherein said dielectric material is silicon nitride.

10. The method of claim 7 wherein said dielectric material is high resistivity polycrystalline silicon.

11. The method of claim 1 wherein said implanted dopant is boron.

12. The method of claim 3 wherein said body region includes a deep body region.

13. The method of claim 1, wherein said trench is formed by providing a masking layer defining at least one trench, and etching the trench defined by the masking layer.

14. The method of claim 3, wherein said body region is formed by implanting and diffusing a dopant into the substrate.

15. The method of claim 1 wherein said power semiconductor device is selected from the group consisting of a vertical DMOS, V-groove DMOS, and a trench DMOS MOSFET, an IGBT, and a bipolar transistor.

16. The method of claim 1 wherein said diffusion facilitating material is polycrystalline silicon.

17. The method of claim 1 wherein said dopant of a second conductivity type is gallium and said diffusion facilitating material is silicon dioxide.

* * * * *